(12) United States Patent
Kusama et al.

(10) Patent No.: US 10,889,438 B2
(45) Date of Patent: Jan. 12, 2021

(54) STOCKER

(71) Applicant: MURATA MACHINERY, LTD., Kyoto (JP)

(72) Inventors: Yu Kusama, Inuyama (JP); Fumiki Goto, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 0 days.

(21) Appl. No.: 16/483,066

(22) PCT Filed: Jan. 11, 2018

(86) PCT No.: PCT/JP2018/000436
§ 371 (c)(1),
(2) Date: Aug. 2, 2019

(87) PCT Pub. No.: WO2018/146987
PCT Pub. Date: Aug. 16, 2018

(65) Prior Publication Data
US 2019/0375587 A1    Dec. 12, 2019

(30) Foreign Application Priority Data

Feb. 7, 2017 (JP) ................................ 2017-020226

(51) Int. Cl.
*B65G 1/04* (2006.01)
*F24F 3/16* (2006.01)
*H01L 21/673* (2006.01)
*H01L 21/677* (2006.01)

(52) U.S. Cl.
CPC ............ *B65G 1/04* (2013.01); *F24F 3/161* (2013.01); *H01L 21/67379* (2013.01); *H01L 21/67389* (2013.01); *H01L 21/67769* (2013.01)

(58) Field of Classification Search
CPC ........ B65G 1/04; F24F 3/161; H01L 21/67389; H01L 21/67769
See application file for complete search history.

(56) References Cited

U.S. PATENT DOCUMENTS 6,251,155 B1 * 6/2001 Fukushima ............ B01D 46/00
454/187

FOREIGN PATENT DOCUMENTS

| JP | 62217056 | * | 9/1987 |
| JP | 362217056 | * | 9/1987 |
| JP | 5251980 B2 | | 7/2013 |

OTHER PUBLICATIONS

Official Communication issued in International Patent Application No. PCT/JP2018/000436, dated Feb. 27, 2018.

* cited by examiner

*Primary Examiner* — Ronald P Jarrett
(74) *Attorney, Agent, or Firm* — Keating & Bennett, LLP

(57) ABSTRACT

A stocker includes a wall that separates inside and outside of the stocker, a storage area on an inner side of the wall to store articles, a duct on a wall side of the storage area and extending in a vertical direction, an inlet at an upper end of the duct to introduce air flowing downward into the duct, a flow regulator to regulate an airflow between an upper side and a lower side of the duct, blowout openings on a storage area side of the duct to blow out air to the storage area, and a fan on a lower side of the flow regulator of the duct to draw in outside air and introduce the outside air into the duct.

5 Claims, 6 Drawing Sheets

Vertical direction

Vertical direction

STOCKER

BACKGROUND OF THE INVENTION

1. Field of the Invention

The present invention relates to a stocker.

2. Description of the Related Art

A stocker is installed in a semiconductor manufacturing factory or the like in order to store a plurality of containers for accommodating reticles, semiconductor wafers or the like. The stocker has: a wall that separates the inside and the outside of the stocker; and a storage area which is arranged on an inner side of the wall and in which articles are stored. In such a stocker, the cleanliness in the storage area is required to be class 4 or higher in accordance with the ISO standard, depending on the container (or the contents of the container) to be stored. For this reason, clean air from outside is introduced into the storage area to achieve the cleanliness in the storage area. For example, there is known a configuration in which an airflow is formed in the horizontal direction in a storage area, using clean air flowing downward from a ceiling fan provided on a ceiling of a building (for example, see Japanese Unexamined Patent Application No. 2000-16521).

In the stocker disclosed in Japanese Unexamined Patent Application No. 2000-16521, an upper side of a duct provided on a back side of the storage area is opened, air caused to flow downward is introduced into the duct by a ceiling fan, and the air is blown in the horizontal direction into the storage area from the duct. Also, a blower motor is provided on a lower side of the duct to feed the air in the stocker into the duct and causes it to circulate therein. In the stocker disclosed in Japanese Unexamined Patent Application No. 2000-16521, since the air flowing downward from the ceiling weakens from the upper side toward the lower side of the duct, the amount of air blown out in the horizontal direction is smaller on the lower side of the storage area than on the upper side. For this reason, air is fed into the duct by the blower motor, and vertical variations are suppressed in the amount of air blown out in the horizontal direction from the duct.

A stocker in which, for example, a fan is arranged on a back side of a duct rather than using air flowing downward from a ceiling fan is also known (for example, see Japanese Patent No. 5251980). In the stocker disclosed in Japanese Patent No. 5251980, an airflow is formed in a storage area by drawing air from the outside of the stocker into the duct and blowing out the air in the horizontal direction into the storage area by means of a fan.

In the stocker disclosed in Japanese Unexamined Patent Application, First Publication No. 2000-16521, the amount of air blown out from the lower side of the duct into the storage area can be ensured. However, since the air in the stocker is fed into the duct from the blower motor and blown out to the storage area again, the cleanliness in the storage area may not be ensured in some cases. In the stocker disclosed in Japanese Patent No. 5251980, if a constant amount of airflow is to be formed over the entire storage area, it is necessary to arrange a plurality of fans in the vertical direction of the duct. This does not only cause an increase in equipment cost as a result of the increased number of fans, but also creates a problem of increased power consumption for driving the fans in the operation of the stocker. Furthermore, if the number of fans increases, the amount of heat generated as a result of driving the fans will also increase, and this may result in an increase in the temperature in the stocker.

SUMMARY OF THE INVENTION

Preferred embodiments of the present invention provide stockers each capable of efficiently forming an airflow in a storage area to ensure cleanliness in the storage area, and reducing or preventing an increase in the temperature in the stocker.

A stocker according to a preferred embodiment of the present invention includes a wall that separates an inside and an outside of the stocker, a storage area on an inner side of the wall to store articles, a duct on a wall side of the storage area and extending in a vertical direction, an inlet at an upper end of the duct to introduce air flowing downward into the duct, a flow regulator to regulate an airflow between an upper side and a lower side of the duct, blowout openings on a storage area side of the duct to blow out air to the storage area, and a fan on a lower side of the flow regulator of the duct to draw in outside air and introduce the outside air into the duct.

Opening ratios of the blowout openings, in an upper portion of the duct, may become greater from an upper portion toward a lower portion thereof. The inlet may introduce, into the duct, air which is caused to flow downward by a ceiling fan provided on a ceiling of a building where the stocker is installed. The stocker may further include a connection wall extending from an upper portion of the wall to the ceiling, and a lid to close an upper end of the storage area. The fan may blow out the outside air introduced into the duct toward the storage area from the blowout openings.

According to a preferred embodiment of the present invention, it is possible, in the upper portion of the duct, to form an airflow by blowing out air, which is introduced downward from the inlet and the flow of which is regulated by the flow regulator, to the storage area from the blowout openings, and it is possible, in the lower portion of the duct, to form an airflow by blowing out outside air, which is drawn from the fan, to the storage area. With this configuration, it is possible to blow out air at an appropriate flow rate to the storage area across the upper side and the lower side of the duct, and efficiently form an airflow in the storage area to easily maintain the cleanliness in the storage area. Since the upper portion of the duct takes in air from the ceiling fan, it is not necessary to provide many fans across the upper side and the lower side of the duct, equipment cost is able to be reduced and power consumption to drive the fan is able to be reduced. Furthermore, since many fans are not required, it is possible to reduce or prevent an increase in the temperature in the stocker (the storage area).

In the configuration in which the opening ratios of the blowout openings increase in the upper portion of the duct, from the upper portion toward the lower portion thereof, the opening ratio increases as the flow rate of the air flowing downward decreases, and as a result, it is possible to achieve a uniform or substantially uniform strength of airflow in the storage area, across the upper side and the lower side thereof. In the configuration in which the inlet introduces air, which is caused to flow downward by the ceiling fan provided on the ceiling of the building where the stocker is installed, into the duct, the air is able to be efficiently taken into the duct from the inlet, using the downflow from the ceiling fan.

In the configuration in which the stocker includes a connection wall extending from an upper portion of the wall to the ceiling, and a lid which closes an upper end of the storage area, air flowing downward from the ceiling fan is able to be efficiently taken into the duct. In the configuration in which the fan blows out the outside air introduced into the duct toward the storage area from the blowout openings, it is possible, in the lower portion of the duct, to efficiently form an airflow in the horizontal direction in the storage area by driving the fan.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
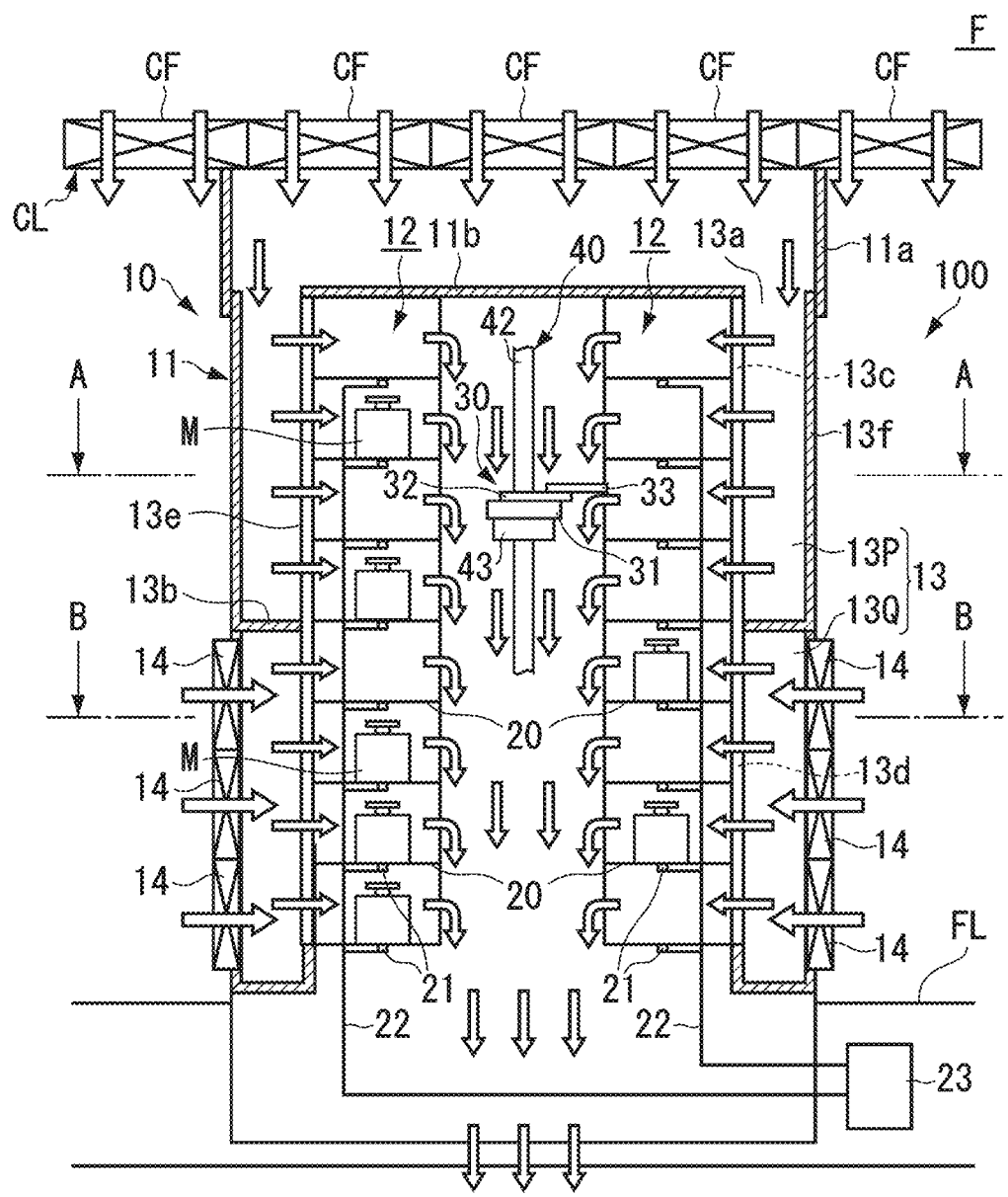
FIG. 1 is a cross-sectional view showing an example of a stocker according to a preferred embodiment of the present invention.

The following describes preferred embodiments of the present invention with reference to the drawings. However, the present invention is not limited to the preferred embodiments. Note that, in the drawings, scale is changed as necessary to illustrate the preferred embodiments, such as by enlarging or by emphasizing a portion.

Figure 2:
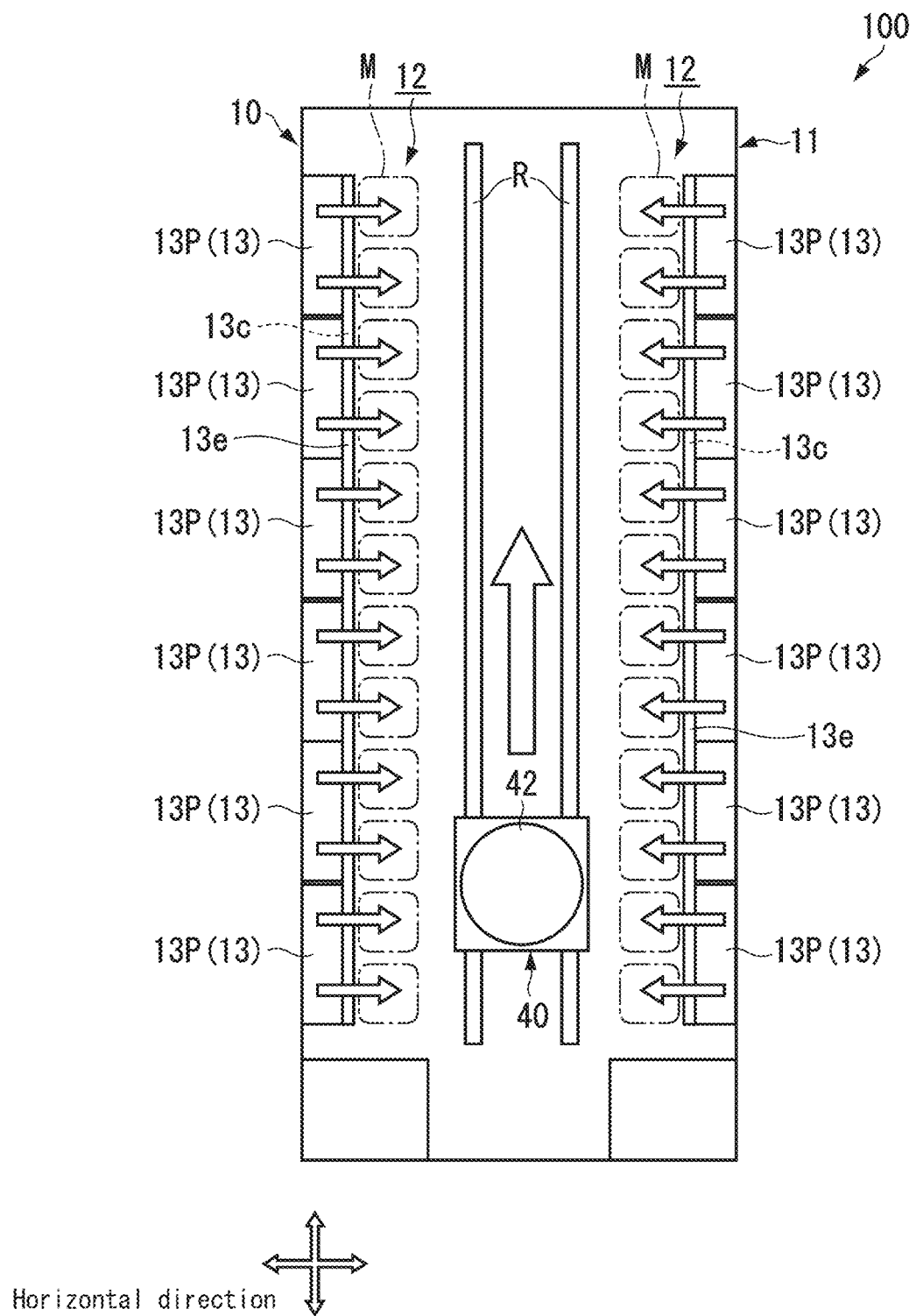
FIG. 2 is a cross-sectional view taken along the line A-A in FIG. 1.
Figure 3:
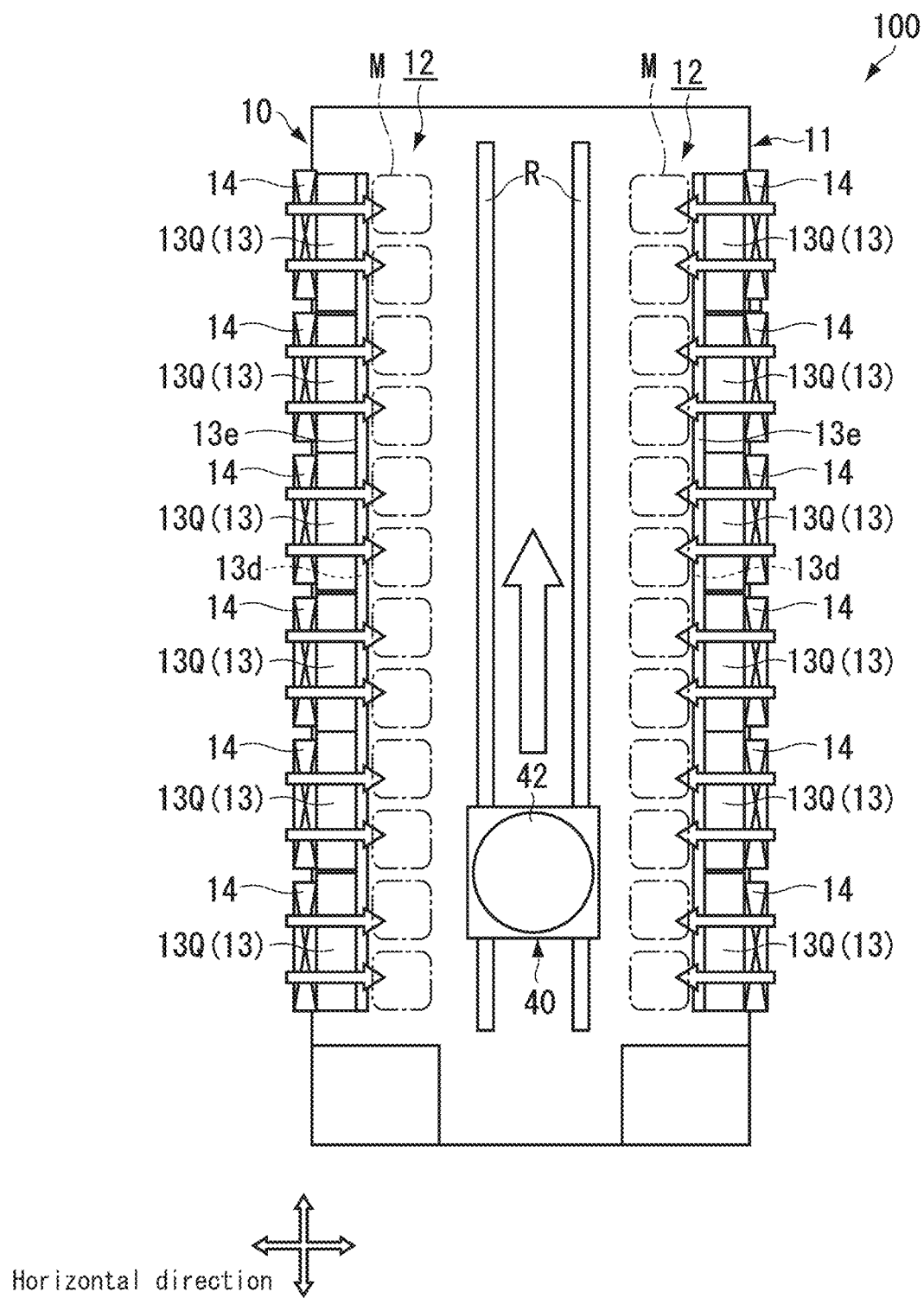
FIG. 3 is a cross-sectional view taken along the line B-B in FIG. 1.

FIG. 1 to FIG. 3 are diagrams showing an example of a stocker 100 according to a preferred embodiment of the present invention. FIG. 1 shows a cross-sectional view of the stocker 100 as viewed from a side (in a traveling direction of a transporter 40). FIG. 2 shows a configuration in a cross-sectional view taken along the line A-A in FIG. 1. FIG. 3 shows a configuration in a cross-sectional view taken along the line B-B in FIG. 1. As shown in FIG. 1 to FIG. 3, the stocker 100 has a main body 10, racks 20, a conveyor 30, and a transporter 40. The stocker 100 stores articles M inside thereof. In the present preferred embodiment, the article M is, for example, a reticle pod that accommodates reticles. The article M accommodates one or several reticles. When accommodating a plurality of reticles, the article M accommodates the reticles in a state of being aligned in the vertical direction.

A main body 10 is installed on the floor FL of a building F such as a semiconductor manufacturing factory, and the temperature and/or the humidity inside thereof are managed. The main body 10 includes a wall 11, storage areas 12, ducts 13, and fans 14. The wall 11 surrounds a space including the storage areas 12 and separates the inside and the outside of the stocker 100. The wall 11 preferably has, for example, a rectangular or substantially rectangular shape when viewed from above. Each storage area 12 is a space in which the articles M are stored, and is provided on the inner side of the wall 11. The storage area 12 is provided on both sides of the area where the transporter 40 (the conveyor 30) travels.

The ducts 13 are respectively arranged on the wall 11 side of the two storage areas 12. Each duct 13 preferably has a rectangular or substantially rectangular box shape for example, and extends in the vertical direction. The duct 13 is vertically provided so as to extend from the bottom portion to the top portion of the storage area 12. As shown in FIG. 2, a plurality of the ducts 13 are juxtaposed along the horizontal direction of the wall 11. In FIG. 2, each duct 13 is provided so as to correspond to two articles M placed on the rack 20, however, preferred embodiments of the present invention are not limited to this configuration, and the duct 13 may be provided so as to correspond to one article M, or the duct may be provided so as to correspond to three or more articles M. The plurality of ducts 13 arranged in the horizontal direction may be of the same size or different sizes.

The duct 13 is provided by arranging an inner duct wall 13e and an outer duct wall 13f at a predetermined interval, and includes an inlet 13a, a flow regulator 13b, and blowout openings 13c, 13d. The outer duct wall 13f defines the wall 11 of the stocker 100. The inlet 13a is located at an upper end of the duct 13. The inlet 13a introduces air flowing downward into the duct 13.

For example, the inlet 13a introduces air that is caused to flow downward by ceiling fans CF provided on a ceiling CL of the building F. A plurality of the ceiling fans CF are arranged on the ceiling CL of the building F, and form a downflow in the building F. A fan filter is used for the ceiling fans CF, for example. The inlet 13a opens upward to take a portion of the downflow (air flowing downward) created by the ceiling fans CF into the duct 13.

The flow regulator 13b is provided in the duct 13. The flow regulator 13b includes, for example, a partitioning plate that separates the upper side and the lower side of the duct 13. The flow regulator 13b regulates the flow of air between the upper side and the lower side of the duct 13. By providing the flow regulator 13b, the air introduced from the inlet 13a is regulated from flowing to the lower side of the duct 13. The flow regulator 13b is not limited to the configuration to separate the upper side and the lower side of the duct 13 without having a clearance therebetween. For example, as the flow regulator 13b, a filter of a low ventilation rate may be used and may be arranged so as to have a clearance to the wall of the duct 13.

Further, the height at which the flow regulator 13b is provided can be set arbitrarily. The flow regulator 13b may be provided, for example, at or near an intermediate position in the vertical direction of the duct 13. When the downflow created by the ceiling fans CF is strong for example, air is sufficiently sent to the lower side of the duct 13, and, therefore, the height of the flow regulator 13b may be set below the intermediate position in the vertical direction of the duct 13. When the downflow created by the ceiling fans CF is weak, air is not sufficiently sent to the lower side of the duct 13, and, therefore, the height of the flow regulator 13b may be set above the intermediate position in the vertical direction of the duct 13. Also, the height of the flow regulator 13b may be changeable in the vertical direction.

The blowout openings 13c, 13d are provided in a duct wall 13e on the storage area 12 side of the duct 13. The blowout openings 13c, 13d are structured so as to blow out the air introduced into the duct 13 toward the storage area 12. The blowout openings 13c are provided in the duct wall 13e of an upper portion 13P of the flow regulator 13b of the duct 13. The blowout openings 13d are provided in the duct wall 13e of a lower portion 13Q of the flow regulator 13b of the duct 13.

Figure 4A:
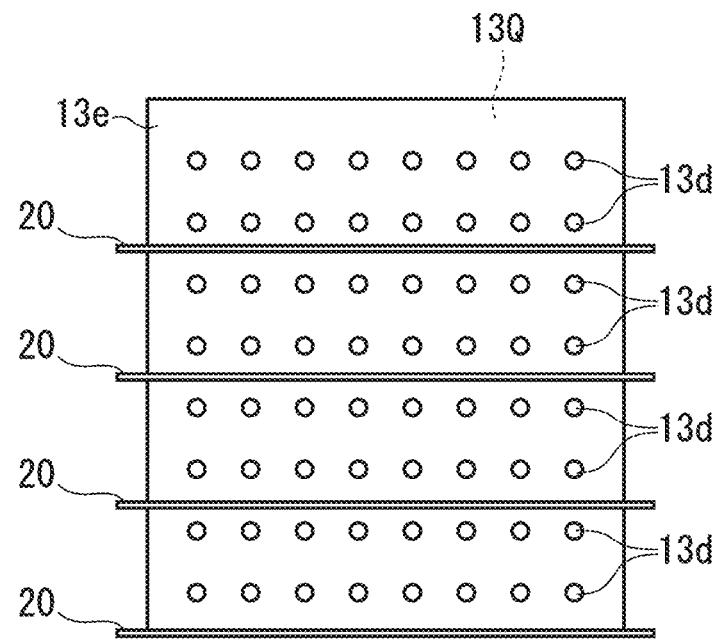
FIGS. 4A and 4B are diagrams each showing an example of blowout openings.
Figure 4B:
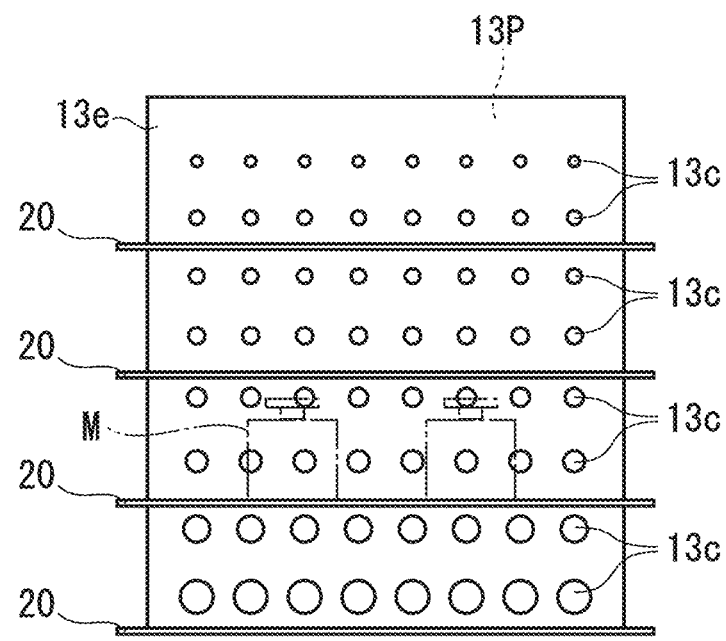

FIGS. 4A and 4B each show an example of the blowout openings 13c, 13d, and show the duct wall 13e as the duct 13 is viewed from the inner side of the stocker 100. FIG. 4A shows an example of the duct wall 13e of the lower portion 13Q, and FIG. 4B shows an example of the duct wall 13e of the upper portion 13P. As shown in FIGS. 4A and 4B, a perforated metal is used for the duct wall 13e, for example. As shown in FIGS. 4A and 4B, in the lower portion 13Q and the upper portion 13P, the blowout openings 13c, 13d are juxtaposed at equal pitches in the vertical direction and in the horizontal direction.

As shown in FIG. 4A, in the lower portion 13Q, a plurality of the blowout openings 13d each having the same opening diameter are arranged in the duct wall 13e. With this configuration, the opening ratio is uniform or substantially uniform from the upper portion to the lower portion in the lower portion 13Q of the duct 13. Accordingly, the air blown out from the lower portion 13Q of the duct 13 toward the storage area 12 has a uniform or substantially uniform flow rate of blown-out air across the upper portion and the lower portion of the lower portion 13Q in the case where the pressure in the lower portion 13Q of the duct 13 is constant across the upper portion and the lower portion thereof.

As shown in FIG. 4B, in the upper portion 13P, there are arranged blowout openings 13c, the opening diameter of which in the duct wall 13e becomes greater from the upper portion toward the lower portion thereof. With this configuration, the opening ratio becomes greater from the upper portion toward the lower portion in the upper portion 13P of the duct 13. The air introduced from the inlet 13a at the upper portion of the duct 13 decreases in pressure, from the upper portion toward the lower portion of the upper portion 13P. Therefore, in the upper portion where the pressure is high, air is blown out toward the storage area 12 from the blowout openings 13c of smaller opening ratios (smaller diameters), and in the lower portion where the pressure is low, air is blown out toward the storage area 12 from the blowout openings 13c of greater opening ratios (greater diameters). The flow rate of air blown out to the storage area 12 becomes uniform or substantially uniform across the upper portion to the lower portion in the upper portion 13P.

The arrangement of the blowout openings 13c, 13d is not limited to that described above, and the blowout openings 13c, 13d may also be arranged at unequal intervals. The shape of the blowout openings 13c, 13d is not limited to a circular shape either, and any shape such as an elliptical shape, an oval shape, and a polygonal shape is applicable. In the upper portion 13P of the duct 13, the opening ratio may be changed linearly from the upper portion to the lower portion, or may be changed non-linearly. Also, the opening ratio need not be changed in a portion of or an entirety of the upper portion 13P of the duct 13.

The fans 14 are provided in the lower portion 13Q of the duct 13. The fans 14 are provided on the outer duct wall 13f of the duct 13 on the opposite side of the storage area 12. The duct wall 13f faces the outside of the stocker 100. Each fan 14 includes an air intake facing the wall 11 of the stocker 100, draws in air outside the wall 11 (the main body 10), and introduces it into the lower portion 13Q of the duct 13. The air outside the wall 11 is the air in the building F, which is part of the downflow created by the ceiling fans CF. The fans 14 are, for example, fan filter units.

The fans 14 introduce the air drawn in from the outside into the duct 13, and blow out the air horizontally (in a direction orthogonal to the traveling direction of the transporter 40) toward the storage area 12 through the lower portion 13Q of the duct 13. That is to say, the air drawn into the lower portion 13Q of the duct 13 by the fans 14 is blown out toward the storage area 12 from the plurality of blowout openings 13d toward the storage area 12. The direction of air blown out from the blowout openings 13d is arbitrary and may be a vertically inclined direction rather than a horizontal direction. Also, this direction may be a direction that is inclined from a direction orthogonal to the traveling direction of the transporter 40.

The fans 14 are arranged in the lower portion 13Q of the duct 13 in the vertical direction with no clearance therebetween as shown in FIG. 1, however, there may be a clearance therebetween. The fans 14 are arranged in the lower portion 13Q of the duct 13 in the horizontal direction with no clearance therebetween as shown in FIG. 3, however, there may be a clearance therebetween. With this configuration, non-uniformity of internal pressure is resolved in the vertical direction and in the horizontal direction in the lower portion 13Q of the duct 13, and when the outside air drawn into the lower portion 13Q is blown out toward the storage area 12, the flow rate of the air can be made uniform or substantially uniform in the vertical direction and in the horizontal direction.

The same fan 14 is used for the plurality of fans 14 arranged, however, preferred embodiments of the present invention are not limited to this configuration. For example, different fans 14 may be arranged in the vertical direction and different fans 14 may be arranged in the horizontal direction. The plurality of fans 14 are not limited to being all driven simultaneously, and may be driven alternately or sequentially. Some or all of the plurality of fans 14 are not limited to being continuously driven, and may be intermittently driven.

As shown in FIG. 1, the main body 10 includes a connection wall 11a and the lid 11b. The connection wall 11a extends from the upper portion of the wall 11 to the ceiling CL. The connection wall 11a surrounds the wall 11 of the stocker 100 as viewed from above. With this configuration, the connection wall 11a guides the air caused to flow downward by the ceiling fans CF of the ceiling CL to the upper side of the stocker 100 (the upper side of the space surrounded by the wall 11). This connection wall 11a makes it easy to take the air caused to flow downward by the ceiling fans CF of the ceiling CL into the inlet 13a of the duct 13.

The lid 11b closes the upper end of the internal space of the stocker 100 including the storage area 12. The lid 11b regulates the air caused to flow downward by the ceiling fans CF of the ceiling CL from entering the stocker 100. As a result, air is blown out to the storage area 12 from the duct 13. The presence of the lid 11b prevents the air from moving toward the upper side from the inside of the stocker 100.

Whether or not to install the connection wall 11a and the lid 11b is arbitrary, and one or both of the connection wall 11a and the lid 11b may be omitted. The connection wall 11a and the lid 11b are not limited to being provided having no clearance therebetween, and may be installed in the state of partly having a clearance therebetween. The connection wall 11a is not limited to extending upward from the wall 11 of the stocker 100. For example, the connection wall 11a may be installed so as to expand outward or to narrow inward from the wall 11.

The racks 20 are arranged in the storage area 12, and are each structured so as to be able to have the article M placed thereon. The racks 20 are supported by a support shaft or the like not shown in the drawings and are provided in a plurality of stages in the vertical direction in the storage area 12. In the present preferred embodiment, such a plurality of racks 20 are respectively arranged on both sides along the traveling direction of the transporter 40. Each rack 20 includes a cutout not shown in the drawings. Each rack 20 may be provided with three pins, not shown in the drawings, on an upper surface thereof, for example. The pins are provided so as to project upward from the upper surface of the rack 20, and can position the article M on the rack 20 by having them inserted into the grooves provided on the bottom surface of the article M.

Each rack 20 includes a supply nozzle 21 provided thereon for a purging apparatus. The supply nozzle 21 is located and structured so as to connect to a purge gas inlet (not shown in the drawings) provided on the bottom surface of the article M when the article M is placed on the rack 20. When the article M is placed on the rack 20, the purge gas inlet of the article M is connected to a purge gas source 23 from the supply nozzle 21 via a pipe 22, and a purge gas is supplied into the article M. The supply nozzle 21 may not be provided in some or all of the racks 20. Supply of the purge gas into the article M may be performed at a location other than the rack 20. For example, the purge gas may be supplied into the article M at a load port (not shown in the drawings) to transport the article M into the stocker 100.

The conveyor 30 transfers the article M to the rack 20 defining and functioning as a transfer location. The conveyor 30 includes a base 31, an extender/retractor 32, and an article holder 33. The base 31 is fixed to an elevation platform 43 described later. The extender/retractor 32 is able to extend to or retract from the base 31. The article holder 33 is attached to a distal end of the extender/retractor 32 and can hold the article M. The article holder 33 is movable, for example, in extending and retracting directions of the extender/retractor 32. A configuration for placing and holding the article M is applied to the article holder 33, and can pass through the cutout of the rack 20 mentioned above in the vertical direction. The conveyor 30 is not limited to the configuration for placing the article M. For example, a configuration to sandwich and hold a flange provided at the upper portion of the article M or a configuration to grip and hold the side surfaces of the article M may be applied to the conveyor 30.

The transporter 40 includes rails R, a traveler (not shown in the drawings) that travels along the rails R, a mast 42 provided on the traveler, and an elevation platform 43 that ascends and descends along the mast 42. The rails R are arranged parallel or substantially parallel to the floor and the ceiling (the lid 11b) in the stocker 100. The rails R are arranged along the storage area 12 in parallel or substantially in parallel with the wall 11, on which the fans 14 are provided. Although two rails R are shown in FIG. 1, the number of the rails is arbitrary, and a single rail R may be used. A traveler traveling on the rails R travels along the rails R via a drive source such as an electric motor. The mast 42 is arranged along the vertical direction, and is moved together with the traveler by the driving of the traveler. The elevation platform 43 is raised or lowered in the vertical direction along the mast 42 by the drive source such as an electric motor, and is held at an arbitrary height.

In the stocker 100 described above, a controller not shown in the drawings controls the operation of transporting the article M into or from the stocker 100 as well as the operation of transferring the article M to the rack 20. When transporting the article M into the stocker 100, after the article M placed in the load port (not shown in the drawings) is received by the conveyor 30, the conveyor 30 is moved by the transporter 40 to the transport destination rack 20. Then, the extender/retractor 32 of the conveyor 30 is extended from the base 31 to move the article holder 33 to above the rack 20. By lowering the elevation platform 43 in this state, the article M is placed on the rack 20. Through this operation, the article M is placed on the rack 20 at the transport destination.

When transporting out the article M, the transporter 40 moves the conveyor 30 to the rack 20, on which the article M to be transported out is placed. Then, the extender/retractor 32 of the conveyor 30 is extended to move the article holder 33 to below the rack 20. By raising the elevation platform 43 in this state, the article M is transferred to the article holder 33 from the rack 20. Then, the extender/retractor 32 is retracted and the article holder 33 having the article M placed thereon is held on the base 31. Thereafter, the transporter 40 moves the conveyor 30 to the load port, and the conveyor 30 transfers the article M on the load port. This operation completes the transportation of the article M.

In the stocker 100 as described above, the cleanliness in the storage area 12 is required to be class 4 or higher, for example, in accordance with the ISO standard, depending on the article M or the contents of the article M to be stored. Therefore, clean air outside the stocker 100 is introduced into the storage area 12 to achieve the cleanliness of the storage area 12. In the present preferred embodiment, in the stocker 100, air caused to flow downward by the ceiling fans CF of the ceiling CL is introduced from the inlet 13a of the duct 13 and blown out to the storage area 12 through the blowout openings 13c, thus forming an airflow in the horizontal direction in the storage area 12. Also, in the stocker 100, air from the outside of the stocker is drawn into the duct 13 by the fans 14 and is blown out to the storage area 12 through the blowout openings 13d, thus forming an airflow in the horizontal direction in the storage area 12.

As described above, in the stocker 100 according to the present preferred embodiment, it is possible, in the upper portion 13P of the duct 13, to form an airflow by blowing out air, which is introduced downward from the inlet 13a and the flow of which is regulated by the flow regulator 13b, to the storage area 12 from the blowout openings 13c. In the lower portion 13Q of the duct 13, it is possible to form an airflow by blowing out outside air, which is drawn in by the fans 14, to the storage area 12. With this configuration, an airflow is able to be easily and also reliably formed across the upper side and the lower side of the storage area 12 and the cleanliness in the storage area 12 is able to be ensured. Since the fans 14 are arranged only in the lower portion 13Q of the duct 13, the installation of many fans 14 is unnecessary and an increase in the temperature in the stocker 100 (the storage area 12) is able to be reduced or prevented. Neither the upper portion 13P nor the lower portion 13Q of the duct 13 allows air to circulate within the stocker 100, and the air taken in from the outside is released downward from the floor surface of the stocker 100 (see FIG. 1). This configuration prevents an increase in the temperature within the stocker 100 (the storage area 12) and enables reduction in the influence of heat on the article M placed on the rack 20 in a storage area 12.

In the above description, the example of the configuration has been described in which in the lower portion 13Q of the duct 13, the fans 14 are arranged with no clearance therebetween in the vertical direction. However, preferred embodiments of the present invention are not limited to this configuration, and the arrangement of the fans 14 can be appropriately changed according to the vertical dimension of the lower portion Q of the duct 13 or according to the capability of the fans 14.

Figure 5:
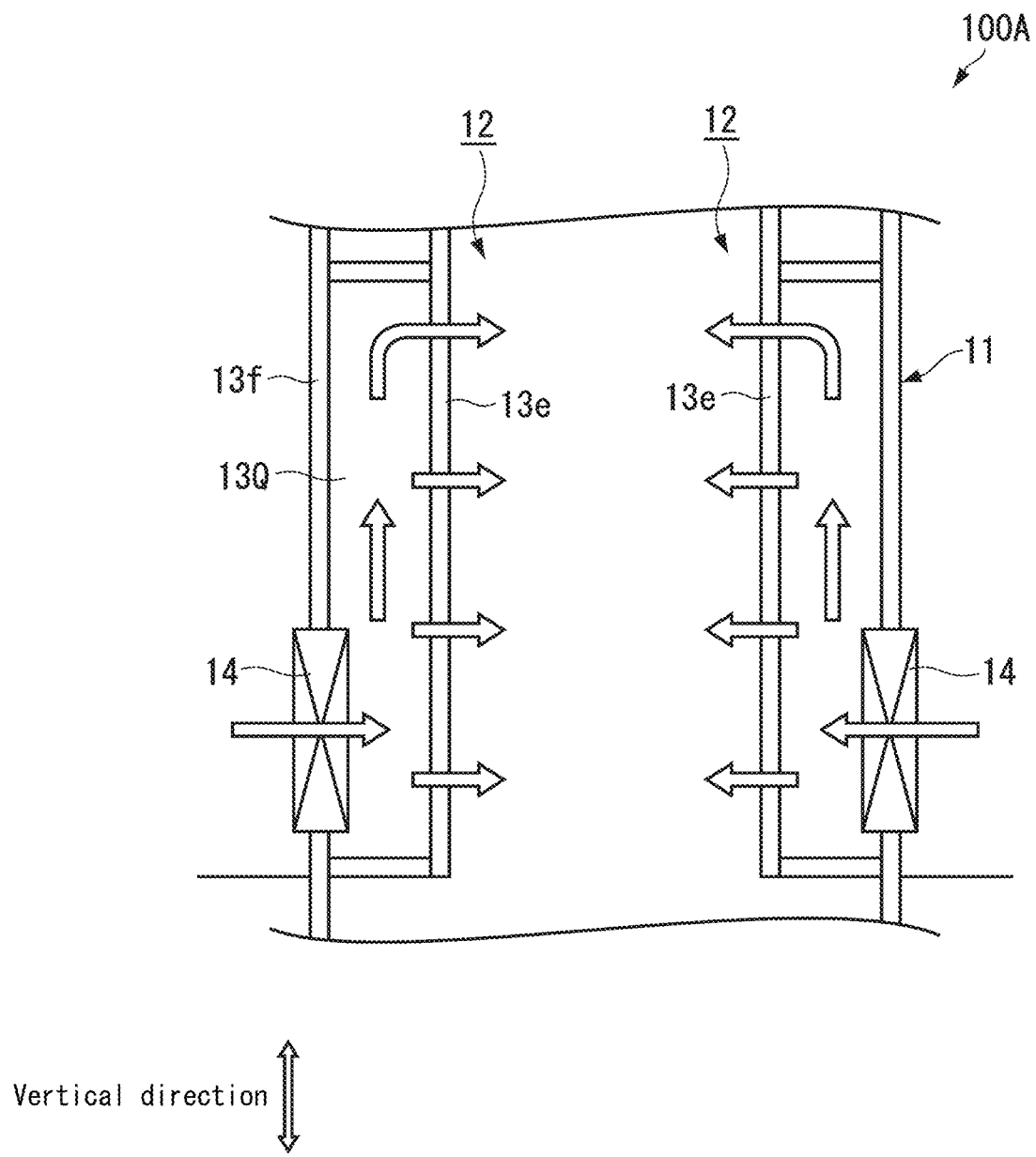
FIG. 5 is a diagram showing another example of the arrangement of fans.

FIG. 5 is a diagram showing another example of the arrangement of the fans 14. The above same configurations as those of the stocker 100 shown in FIG. 1 except for the arrangement of the fans 14 are applied to a stocker 100A shown in FIG. 5. As shown in FIG. 5, when the dimension in the vertical direction of the lower portion 13Q of the duct 13 is shorter than that of the above preferred embodiment, or when high performance fans 14 (which draw in a larger amount of air or blow out a larger amount of air per unit time) are used, the number of installed fans 14 is able to be reduced without having to arrange the fans 14 in the vertical direction with no clearance therebetween. Although a single fan 14 is shown in FIG. 5, a plurality of fans 14 may be provided at intervals.

As described above, when the vertical dimension of the lower portion 13Q is short, or when high-performance fans 14 are used, a sufficient airflow is able to be supplied to the storage area 12 from the blowout openings 13d even if the number of installed fans 14 is reduced. This configuration enables reduction in the equipment cost and the cost of driving the fans 14.

Figure 6:
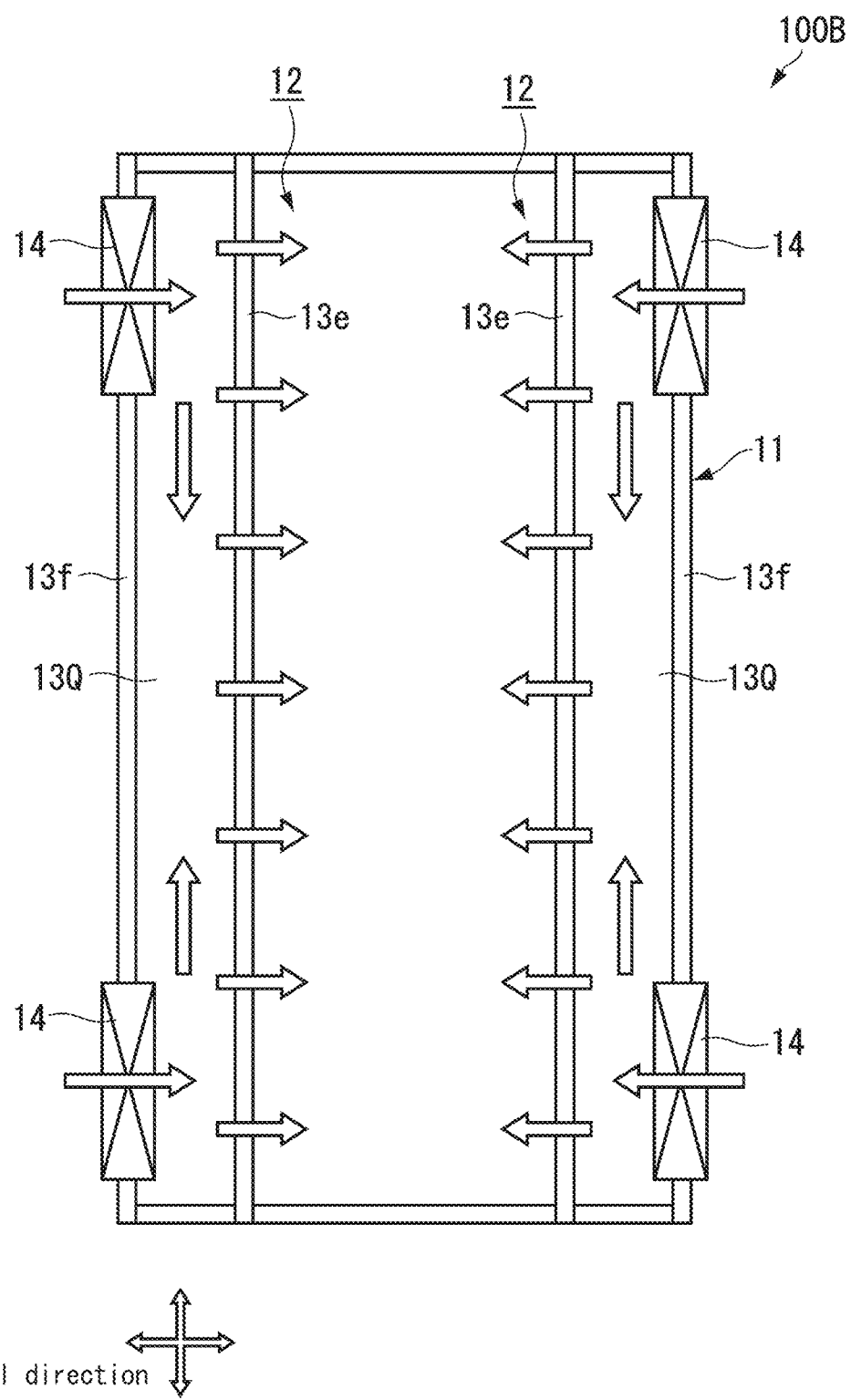
FIG. 6 is a diagram showing another example of the arrangement of fans.

Although in the above description, it has been described that the fans 14 can be installed at intervals instead of arranging the fans 14 with no clearance therebetween in the vertical direction, the same applies to the horizontal direction. FIG. 6 is a diagram showing another example of the arrangement of the fans 14. The above same configurations as those of the stocker 100 shown in FIG. 1 except for the arrangement of the fans 14 are applied to a stocker 100B shown in FIG. 6. As shown in FIG. 6, when the dimension in the left-right direction of the lower portion 13Q of the duct 13 is shorter than that of the above preferred embodiments, or when high performance fans 14 are used, the number of installed fans 14 is able to be reduced without having to arrange the fans 14 in the left-right direction with no clearance therebetween.

As described above, when the dimension in the left-right direction of the lower portion 13Q, or when high performance fans 14 are used, a sufficient airflow is able to be supplied to the storage area 12 from the blowout openings 13d even if the number of installed fans 14 is reduced. This configuration enables reduction in the equipment cost and the cost of driving the fans 14.

Preferred embodiments of the present invention have been described above. However, the present invention is not limited to the above description, and various modifications may be made without departing from the gist of the present invention. For example, in the above preferred embodiments, the configuration, in which the opening ratio of the blowout openings 13c becomes greater from the upper portion toward the lower portion in the upper portion 13P of the duct 13, has been described as an example, however, the present invention is not limited thereto. For example, the blowout openings 13c may have a uniform opening ratio from the upper portion to the lower portion of the duct 13.

In the preferred embodiments described above, the configuration, in which the inlet 13a of the duct 13 introduces air caused to flow downward by ceiling fans CF provided on the ceiling CL of the building F, has been described as an example, however, the present invention is not limited thereto. For example, the inlet 13a of the duct 13 may introduce air flowing downward by a structure or method different from the ceiling fans CF. Furthermore, the contents of Japanese Patent Application No. 2017-020226 and all documents cited in the detailed description of the present invention are incorporated herein by reference to the extent permitted by law.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A stocker comprising:
a wall that separates an inside and an outside of the stocker;
a storage area on an inner side of the wall to store articles;
a duct on a wall side of the storage area and extending in a vertical direction;
an inlet at an upper end of the duct to introduce air flowing downward into the duct;
a flow regulator including a partitioning plate to at least partially separate an upper side and a lower side of the duct and to regulate an airflow between the upper side and the lower side of the duct;
blowout openings on a storage area side of the duct to blow out air to the storage area; and
a fan on a lower side of the flow regulator of the duct to draw in outside air directly from the outside of the stocker and to introduce the outside air into the duct.

2. The stocker according to claim 1, wherein opening ratios of the blowout openings, in an upper portion of the duct, increase from an upper portion toward a lower portion; and
the opening ratios of the blowout openings are ratios of an area of a respective one of the blowout openings to an area of the duct on the storage area side of the duct.

3. The stocker according to claim 1, wherein the inlet introduces, into the duct, air which is caused to flow downward by a ceiling fan provided on a ceiling of a building where the stocker is installed.

4. The stocker according to claim 3, further comprising:
a connection wall extending from an upper portion of the wall to the ceiling; and
a lid that closes an upper end of the storage area.

5. The stocker according to claim 1, wherein the fan blows out the outside air introduced into the duct toward the storage area from the blowout openings.

* * * * *